(12) United States Patent
Yamamoto et al.

(10) Patent No.: US 11,015,768 B2
(45) Date of Patent: May 25, 2021

(54) METHOD OF MANUFACTURING LIGHT SOURCE DEVICE

(71) Applicant: NICHIA CORPORATION, Anan (JP)

(72) Inventors: Atsushi Yamamoto, Komatsushima (JP); Takeshi Tamura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 35 days.

(21) Appl. No.: 16/375,452

(22) Filed: Apr. 4, 2019

(65) Prior Publication Data
US 2019/0309913 A1 Oct. 10, 2019

(30) Foreign Application Priority Data

Apr. 6, 2018 (JP) .............. JP2018-074008

(51) Int. Cl.
| | |
|---|---|
| *H01L 25/075* | (2006.01) |
| *F21K 9/66* | (2016.01) |
| *H01L 21/66* | (2006.01) |
| *H01L 33/46* | (2010.01) |
| *F21K 9/64* | (2016.01) |
| *F21K 9/68* | (2016.01) |
| *F21K 9/90* | (2016.01) |

(Continued)

(52) U.S. Cl.
CPC ............ *F21K 9/66* (2016.08); *F21K 9/64* (2016.08); *F21K 9/68* (2016.08); *F21K 9/69* (2016.08); *F21K 9/90* (2013.01); *H01L 22/20* (2013.01); *H01L 25/0753* (2013.01); *H01L 33/46* (2013.01); *H01L 33/507* (2013.01); *F21Y 2105/16* (2016.08); *H01L 2933/0025* (2013.01); *H01L 2933/0041* (2013.01)

(58) Field of Classification Search
CPC ..... F21K 9/66; F21K 9/68; F21K 9/69; F21K 9/90; F21K 9/64; F21V 3/0625; F21V 7/0016; H01L 25/0753; H01L 33/0095; H01L 33/46; H01L 22/20; H01L 33/507; H01L 2933/0041; H01L 2933/0025; H01L 33/60; H01L 2933/0058; F21Y 2105/16; F21Y 2115/10
See application file for complete search history.

(56) References Cited

U.S. PATENT DOCUMENTS

| | | |
|---|---|---|
| 2009/0003002 A1 | 1/2009 | Sato |
| 2015/0028373 A1 | 1/2015 | Abe et al. |

(Continued)

FOREIGN PATENT DOCUMENTS

| | | |
|---|---|---|
| JP | H6-46019 A | 2/1994 |
| JP | 2003-046134 A | 2/2003 |

(Continued)

*Primary Examiner* — Thanh T Nguyen
(74) *Attorney, Agent, or Firm* — Global IP Counselors, LLP

(57) ABSTRACT

A method of manufacturing a light source device includes: providing a substrate having a plurality of light sources disposed thereon; causing the plurality of light sources to emit light; measuring a first light-intensity distribution of an entire surface that is in parallel to the substrate and located above the plurality of light sources; and based on a measured value of the first light-intensity distribution, forming a light-reflecting pattern above the plurality of light sources to obtain a second light-intensity distribution that is different from the first light-intensity distribution.

23 Claims, 11 Drawing Sheets

(51) Int. Cl.
  *F21K 9/69* (2016.01)
  *H01L 33/50* (2010.01)
  *F21Y 105/16* (2016.01)

(56) References Cited

U.S. PATENT DOCUMENTS

| | | |
|---|---|---|
| 2015/0185137 A1 | 7/2015 | Amari |
| 2015/0219936 A1 | 8/2015 | Kim et al. |
| 2017/0363910 A1* | 12/2017 | Fukuda ............. G02F 1/133605 |
| 2018/0080625 A1* | 3/2018 | Yamada ............ G02F 1/133606 |

FOREIGN PATENT DOCUMENTS

| | | |
|---|---|---|
| JP | 2005-508093 A | 3/2005 |
| JP | 2007-003852 A | 1/2007 |
| JP | 2008-027886 A | 2/2008 |
| JP | 2008-282744 A | 11/2008 |
| JP | 2010-271516 A | 12/2010 |
| JP | 2012-064476 A | 3/2012 |
| JP | 2015-026698 A | 2/2015 |
| JP | 2015-144234 A | 8/2015 |
| JP | 2015-149469 A | 8/2015 |
| JP | 2018-045972 A | 3/2018 |
| WO | 03038902 A2 | 5/2003 |

* cited by examiner

METHOD OF MANUFACTURING LIGHT SOURCE DEVICE

CROSS-REFERENCE TO RELATED PATENT APPLICATION

The present application claims priority under 35 U.S.C. § 119 to Japanese Patent Application No. 2018-074008, filed Apr. 6, 2018. The contents of Japanese Patent Application No. 2018-074008 are incorporated herein by reference in their entirety.

BACKGROUND

Technical Field

The present disclosure relates to a method of manufacturing a light source device.

Description of Related Art

Light source devices of surface-emission type, in which a plurality of light emitting elements are arranged in a matrix, alternate rows, or the like, have been proposed, for example, in Japanese Unexamined Patent Application Publication No. 2008-27886.

SUMMARY

Various attempts have been made to obtain a uniform spatial distribution of light emitted from such light source devices of surface-emission type. However, when such a plurality of light emitting elements are assembled into a light source device, reduction in an uneven spatial distribution of light within the entire light-emitting surface may be limited to some degree due to individual differences in members or a combination thereof used for, for example, wavelength converting, diffusing, absorbing, and/or transmitting, of light emitted from light emitting elements, or to individual differences of the light emitting elements. Individual differences in the light emitting elements and/or members used therein used in a single light source device are also difficult to prevent, which may also attribute to the difficulty in obtaining a uniform spatial distribution of light within the entire light-emitting surface.

A method of manufacturing a light source device according to the present disclosure includes: providing a substrate having a plurality of light sources disposed thereon; causing the plurality of light sources to emit light; measuring a first light-intensity distribution of an entire surface that is in parallel to the substrate and located above the plurality of light sources; and based on a measured value of the first light-intensity distribution, forming a light-reflecting pattern above the plurality of light sources to obtain a second light-intensity distribution that is different from the first light-intensity distribution.

The method of manufacturing a light source device described above can realize, through simpler procedure, more uniform distribution of light within a light-emitting plane of a surface-emission type light source device having a plurality of light emitting elements arranged in a matrix or in alternate rows.

DESCRIPTION OF THE EMBODIMENTS

Figure 1:
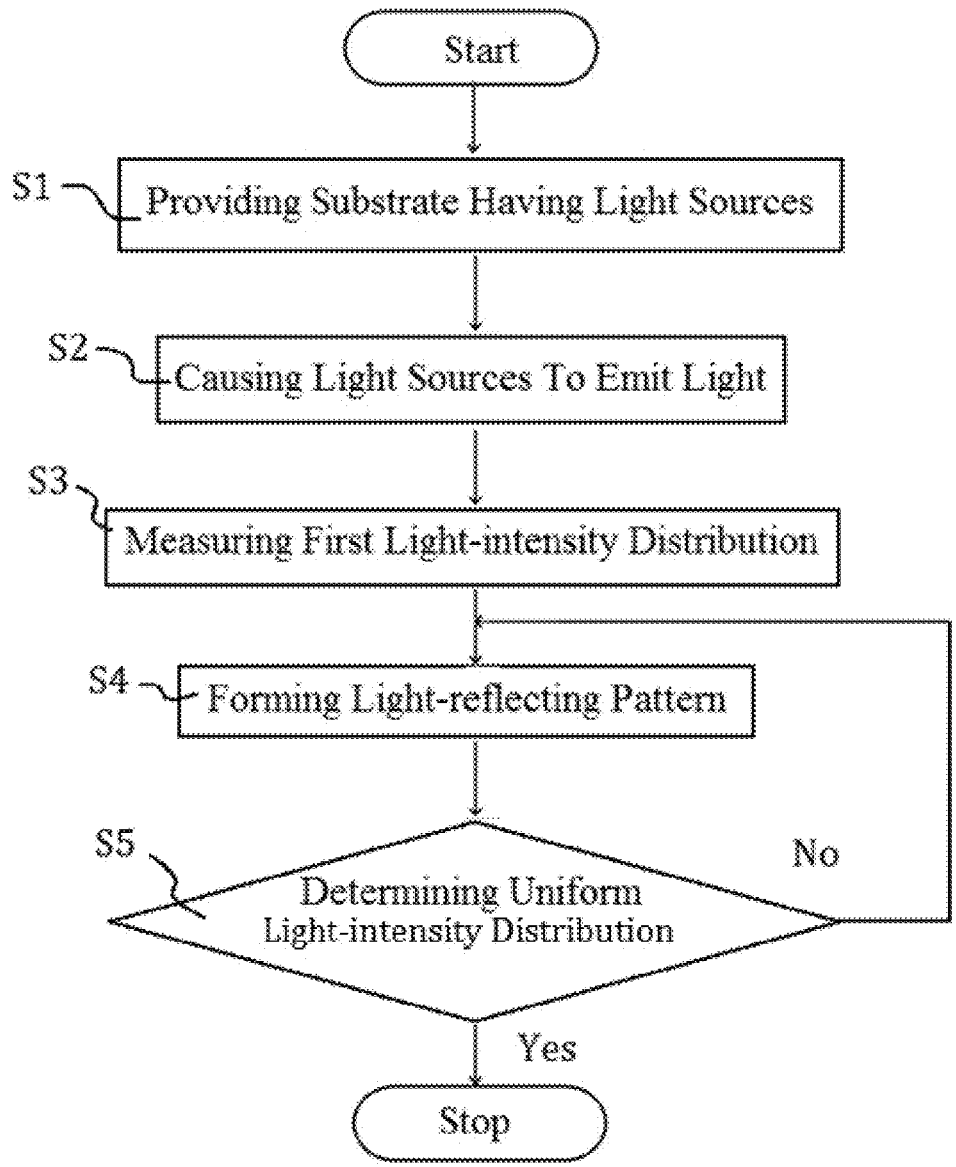
FIG. 1 is a flowchart illustrating a method of manufacturing a light emitting device according to one embodiment of the present invention.

Certain embodiments according to the present disclosure will be described below with reference to the accompanying drawings. It is to be noted that the light emitting device described below is intended for implementing the technical concept of the present invention, and the present invention is not limited to those described below unless otherwise specified. Description given in one example and one embodiment can also be applied in other examples embodiments of embodiments. Note that, the size, positional relationship and the like in the drawings may be exaggerated for the sake of clarity.

A method of manufacturing a light source device includes, for example, as shown in FIG. 1, providing a substrate having a plurality of light sources disposed thereon (S1), causing the plurality of light sources to emit light and measuring a first light-intensity distribution (S2, S3), and based on a measured value of the first light-intensity distribution, forming a light-reflecting pattern (S4) to obtain a second light-intensity distribution that is different from the first-light intensity distribution.

The method allows for more uniform distribution of light within a light-emitting surface of a surface-emission type light source device having a plurality of light emitting elements arranged, for example, in a matrix or in alternate rows, through a simpler and more reliable method of measuring a light-intensity distribution and adjusting accordingly the plurality of light emitting elements disposed on the substrate or an assembled state thereof, even in the presence of variation in the light emitting elements, or in the presence of variation in respective members or combinations of the members used for wavelength conversion, diffusion, absorption, reflection, transmission, or the like of light emitted from the light emitting element when assembled into a light source device. The use of the method allows for uniform light intensity distribution within the light-emitting surface of individual light sources, and further allows for measuring and adjusting the in-plane light-intensity distribution for each light source device. Accordingly, manufacturing of high quality light source devices can be realized.

Providing Substrate

A plurality of light sources and a substrate on which the plurality of light emitting devices to be arranged are provided.

Substrate 10

Figure 2A:
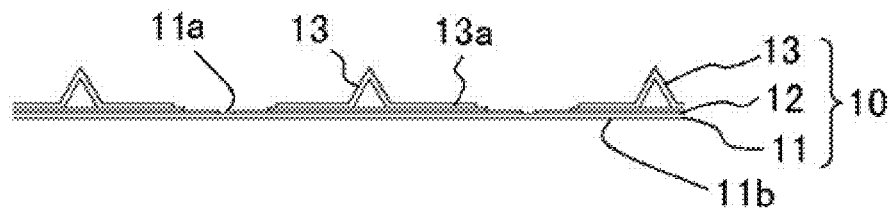
FIGS. 2A to 2E are schematic cross-sectional views illustrating a method of manufacturing the optical component according to one embodiment of the present invention.

The substrate 10 is to support a plurality of light sources, and the shape, material, or the like can be appropriately selected. For example, as shown in FIG. 2A, a base member 11 having a plate-like shape and a flat upper surface is preferably used for the substrate 10, with an electrically conductive wiring layer 12 being preferably disposed on a surface (hereinafter may be referred to as an upper surface 11$a$) where the light sources are to be disposed. The material of the base member 11 can be appropriately selected from electrically insulating materials, electrically conductive materials, and composite materials of those. For example, the material of the base member 11 can be selected from resins, ceramics, or the like. In view of low cost and ease of molding, resin is preferably used. Examples of the resin include phenol resin, epoxy resin, polyimide resin, BT resin, polyphthalamide (PPA), polyethylene terephthalate (PET), urethane resin, acrylic resin, polycarbonate resin, oxetane resin, silicone resin, and modified silicone resin. A resin material having a light-reflecting material made of oxide particles such as titanium oxide, aluminum oxide, or silicon oxide dispersed therein may be used. With the use of such materials, light from the light source can be reflected on the upper surface of the substrate, and leakage and absorption of light at the substrate side can be prevented or reduced, and accordingly, the light extraction efficiency of the light emitting device can be improved. Because of good heat-resisting properties and good light-resisting properties, ceramics may be used. Examples of ceramics include alumina, mullite, forsterite, glass ceramics, nitride-based ceramics (for example, AN), carbide-based ceramics (for example, SiC), and LTCC. Examples of composite materials include the resins described above having an inorganic filler such as glass fiber, $SiO_2$, $TiO_2$, or $Al_2O_3$ mixed therein, and glass fiber reinforced resin (glass epoxy resin). Accordingly, an improvement in the mechanical strength, a reduction in the thermal expansion coefficient, an improvement in the optical reflectance, etc., of the base member 11 can be achieved. The base member 11 may have a layered structure.

Electrically Conductive Wiring Layer 12

The electrically conductive wiring layer 12 has a wiring pattern configured to supply electric power from the outside to each of the light sources. The material of the electrically conductive wiring layer 12 is such that if a ceramics material is used for the base member 11, a high melting temperature metal that can be calcined with the ceramics material of the base member 11 is preferably used. For example, a high melting temperature metal such as tungsten, molybdenum, or the like can be used. If a glass epoxy material is used for the base member 11, a material offering ease of processing is preferably used for the electrically conductive wiring layer 12. For example, copper, nickel, or the like may be applied by plating, sputtering, vapor deposition, press-bonding, or the like. The electrically conductive wiring layer 12 may include a multilayer film. For example, the electrically conductive wiring layer 12 may include a pattern made of a high melting temperature metal formed using a technique as described above, and a metal layer containing one or more other metals such as nickel, gold, and silver, deposited on the pattern by plating, sputtering, vapor deposition, or the like.

A light-reflecting electrically insulating layer is preferably disposed on the electrically conductive wiring layer 12. Examples of the light-reflecting material include the materials similar to those illustrated for the base member 11. Further, a metal layer may be disposed on a lower surface 11$b$ of the base member 11. The metal layer may be disposed, for example, on an entire lower surface 11$b$ of the base member Wall Part 13

Figure 4A:
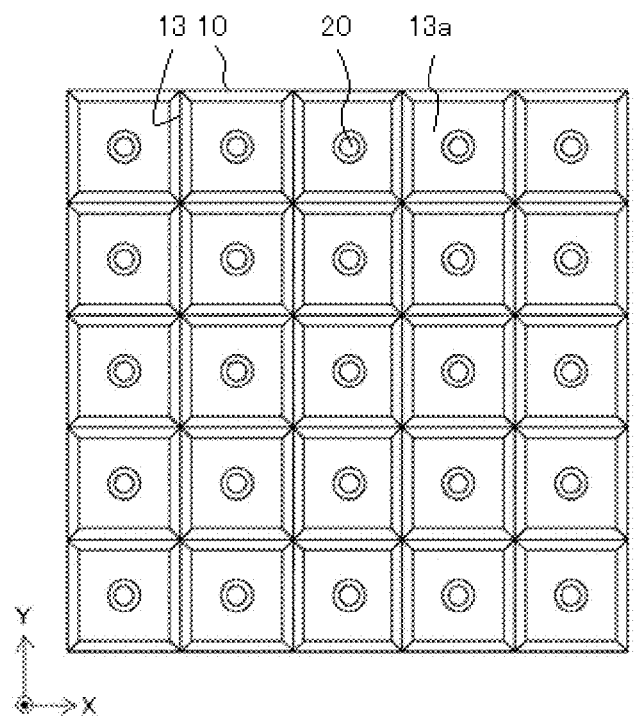
FIG. 4A is a plan view showing one example of a substrate, the first light-intensity distribution thereof to be measured in the method of manufacturing a light emitting device according to the present invention.

The substrate 10 may further includes wall parts 13 surrounding each of the plurality of light sources. The wall parts 13 are configured to reflect light emitted from corresponding light sources such that the light can be emitted upward. The wall parts 13 surrounding each of the plurality of light sources may extend normal to the upper surface of the substrate 10, but as shown in FIG. 2A, the wall parts 13 are preferably such that each of the wall parts 13 is slanted outwardly (i.e., away from the corresponding light source) from the upper surface of the substrate 10. The wall parts 13 may be formed with a material similar to that of the base member 11, and the light-reflecting material described above may be contained in the wall parts 13 or disposed on the surfaces of the wall parts 13. In particular, the wall parts 13 preferably contain the light-reflecting material, and more preferably, the wall parts 13 are formed with a material that can reflect 70% or greater light emitted from corresponding light sources. Each of the region demarcated by the wall parts 13 preferably has a polygonal shape in plan view. This can facilitate demarcating the light-emitting area by the wall parts 13 into a desired number, which is appropriate for the planar dimensions of the light-emitting surface of the surface light-emitting device. Examples of such a polygonal shape include a square shape, a rectangular shape, and a hexagonal shape. The wall parts 13 can be formed by using, for example, a die molding method or an optical molding method. Examples of die molding methods include injection molding, extrusion molding, compression molding, vacuum forming, pressure forming, and press forming. For example, as shown in FIG. 4A, the wall parts 13 are preferably disposed along a x-direction and a y direction such that each of the enclosed regions for disposing the light source 20 has a quadrangular shape. As shown in FIGS. 2A-2E, the wall parts 13 have two slopes with a triangular cross-section. The wall parts 13 may have a height of, for example, 8.0 mm or less. In a light emitting device of a thinner-type, the wall parts 13 may have a height in a range of about 1.0 mm to about 4.0 mm.

Light Source 20

The light sources 20 are members configured to emit light, and include, for example, light emitting elements that are configured to produce light, light emitting element(s) enclosed by a light-transmissive resin or the like, and a packaged surface-mounting type light emitting device.

Each of the light sources 20 includes a light emitting element 21 having a light-emitting surface. For the light emitting element 21, a known semiconductor light emitting element such as a semiconductor laser element, a light emitting diode, or the like can be employed. The light emitting element 21 includes, for example, a semiconductor layered structure. The semiconductor layered structure may include an active layer and an n-type semiconductor layer and a p-type semiconductor layer interposing the active layer. An n-side electrode is electrically connected to the n-type semiconductor layer and a p-side electrode is electrically connected to the p-type semiconductor layer. The n-side electrode and the p-side electrode may be provided on a surface opposite to the light emitting surface of the light emitting element 21. For the light emitting element 21, a semiconductor light emitting element to emit light of a predetermined wavelength can be selected. For example, for a blue light emitting element and a green light emitting element, a light emitting element utilizing ZnSe, a nitride-based semiconductor ($In_XAl_YGa_{1-X-Y}N$, $0 \leq X$, $0 \leq Y$, $X+Y \leq 1$), or GaP can be used. For example, for a red light-emitting element, a light emitting element having a semiconductor such as GaAlAs, AlInGaP, or the like can be used. Semiconductor light emitting elements made of materials other than those described above may also be used. The emission wavelengths of the light emitting elements 21 can be variously determined by the materials and mixed crystal ratio of the semiconductor layer. The composition, emission color, dimensions, number, or the like of the light emitting element can be appropriately selected according to intended usage.

The light source 20 configured to emit, for example, blue light or white light can be used. When the light source is configured to emit white light, the light emitting element 21 to emit white light may be employed, or light emitted from the light emitting element 21 is converted into white light by passing through a covering member 24 to be described later below. The number and type of the light emitting elements included in each of the light source 20 may be either one or plural. For example, the light source 20 configured to emit white light may include one or more light emitting elements each having three light emitting parts configured to emit red light, blue light, and green light, respectively, or may include three light emitting elements configured to emit red light, blue light, and green light, respectively, such that red light, blue light, and green light are mixed to produce white light. The light source 20 may include a light emitting element to emit white light and a light emitting element to emit white light and a light emitting element to emit light of other color. The color rendering properties of light emitted from the light source 20 can be improved with the use of a light emitting element to emit white light and a light emitting element to emit light of other color.

The light source 20 of any appropriate light distributing properties can be employed, but for example, when the light source 20 is surrounded by the wall parts 13 on the substrate 10, the light source 20 preferably has a wide light distribution such that emission of light with a small difference in brightness can be achieved at each region surrounded by the wall parts 13. In particular, each of the light source 20 preferably produce a batwing light distribution. This allows for a reduction in the amount of light emitted in a perpendicularly upward direction relative to the light source 20, which allows for expansion of distribution of light of each of the light source 20. The expanded light is irradiated on the wall parts 13 and reflected, and thus difference in brightness in each of the regions surrounded by the wall parts 13 can be reduced or substantially eliminated. As shown in FIG. 3B, the term "batwing light distribution" used herein can be defined as an emission intensity distribution exhibiting stronger emission intensities at angles with absolute values of light distribution angle greater than zero at 0°, with respect to the optical axis L at 0°. The optical axis L can be generally defined as a line passing through the center of the light source and perpendicular to (a line in) the plane of the substrate.

Figure 3A:
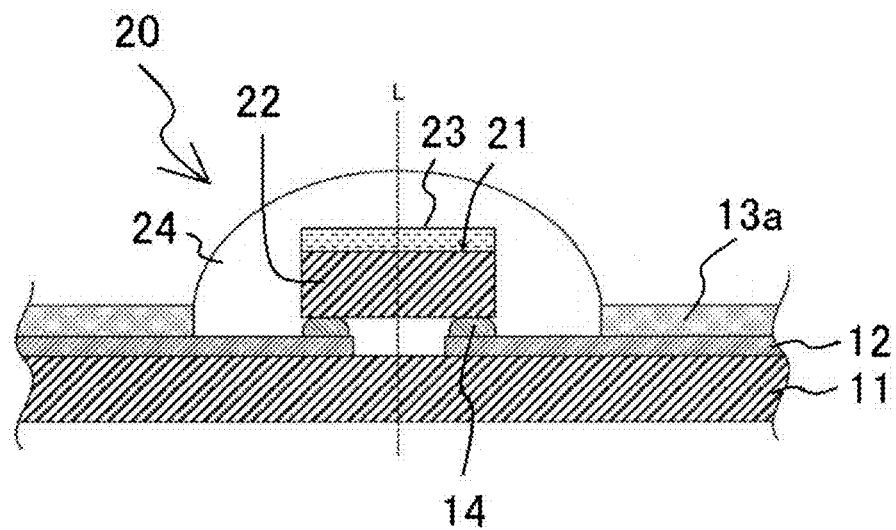
FIG. 3A is a schematic cross-sectional view showing a light source used in the method of manufacturing a light emitting device according to one embodiment of the present invention.
Figure 3B:
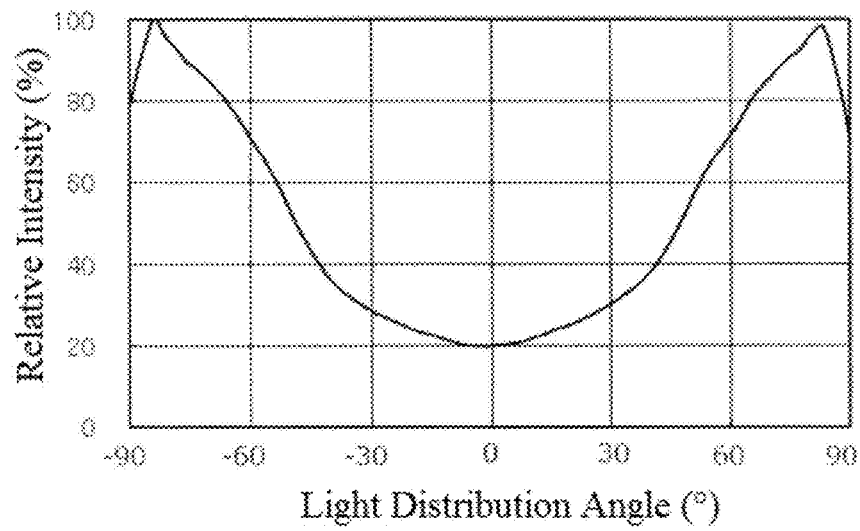
FIG. 3B is a graph showing light distribution characteristics of the light source shown in FIG. 3A.

The light source 20 configured to produce a batwing light distribution may have a structure as shown in FIG. 3A, in which a light emitting element 21 having a light-reflecting film 23 on its upper surface of the semiconductor layered structure 22 is covered by a sealing member 24. The sealing member 24 may be formed after disposing the light sources 20 on the substrate 10. The light-reflecting film 23 may be a metal film, a dielectric multilayer film (DBR film), or the like, with either a single-layer structure or a multilayer structure. Accordingly, light in upward direction emitted from the light emitting element 21 is reflected at the light-reflecting film 23 such that the amount of light directly above the light emitting element 21 is reduced to produce a batwing light distribution. The light-reflecting film 23 can be disposed directly on the upper surface of the light emitting element 21, which can eliminate the need for a batwing lens, thus allowing a reduction in the thickness of the light source 20. For example, the height of the light emitting elements 21 directly mounted on the substrate 10 can be in a range of 100 μm to 500 μm and the thickness of the light-reflecting film 23 can be in a range of 0.1 μm to 3.0 μm. Thus, even including the covering member 24 to be discussed below, the thickness of the light source 20 can be in a range of about 0.5 mm to about 2.0 mm.

The light-reflecting film 23 preferably has an associated reflectivity that exhibits angle dependence on the incidence angle to the emission wavelength of the light emitting element 21. More specifically, the light-reflecting film 23 is configured to have a smaller reflectance for obliquely incident light than that for perpendicularly incident light. With this arrangement, a gradual change in the luminance can be obtained directly above the light emitting element 21 and accordingly, occurrence of undesirable darker portion, such as occurrence of perceivably darker portion directly above the light emitting element 21 can be prevented or reduced.

Figure 2B:
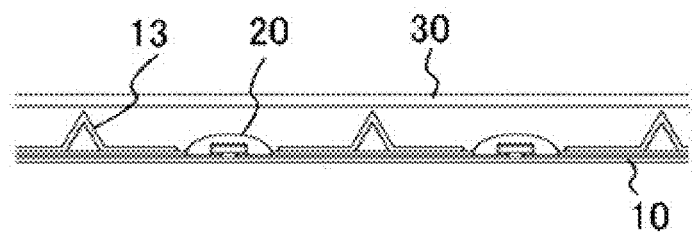

A plurality of light sources and a substrate to support the plurality of the light sources thereon are provided. The plurality of light sources 20 are disposed on the substrate 10 as shown in FIG. 2B to provide the substrate 10 having the plurality of light sources disposed thereon (Step S1 in FIG. 1). The plurality of light sources 20 can be arranged regularly in columns, in a matrix or the like, or randomly on the substrate 10. In particular, the plurality of light sources 20 are preferably arranged in a two-dimensional array along two directions that are perpendicular to each other, as the x-direction and the y-direction shown in FIG. 4A. The plurality of light sources 20 may be arranged at substantially equal intervals in the x-direction and the y-direction, or at different intervals in the x-direction and the y-direction. The light sources 20 are preferably arranged on an upper surface of the substrate using a bonding member. More specifically, as shown in FIG. 3A, the n-side electrode and the p-side electrode of each of the light emitting elements 21 described above are arranged bridging the electrically conductive wiring layers 12 disposed on the upper surface of the substrate 10, and then electrically connected thereto and through a bonding member 14 and secured. That is, in the example illustrated in FIG. 3A, the light emitting element 21 is mounted on the substrate 10 by flip-chip bonding. The bonding member 14 preferably has electrically conducting properties, and for example, a solder such as Sn—Bi-based, Sn—Cu-based, Sn—Ag-based, or Au—Sn-based, a eutectic alloy such as an alloy having Au and Sn as its main components, an alloy having Au and Si as its main component, and an alloy having Au and Ge as its main component, a brazing material of a low-melting-point metal, an adhesive made of a combination of those, or the like may be employed. Such materials can be appropriately selected according to the materials or the like of the light source and the substrate. When the p-side electrode and the n-side electrode are electrically connected to the electrically conductive wiring layer 12 through wires or the like, the bonding member 14 is provided to secure the regions of the light emitting element 12, other than the p-side electrode and the n-side electrode, on the substrate, such that establishing electrical connection between the light emitting element 21 and the electrically conductive wiring layers 12 through the bonding member is not required. A light-reflecting underfill may be disposed between the substrate 10 and the light emitting element 21, and a light-reflecting layer 13a may be disposed in a region of the electrically conductive wirings 12 to regions not to be used for establishing electrical connection. The light-reflecting layer 13a can be disposed by using the material similar to that used to form the wall parts 13.

The covering member 24 covers the light emitting element 21 and the light-reflecting film 23 disposed on the light emitting element 21, and with the light emitting element 21, the covering member 24 is held on the substrate 10. Accordingly, the covering member 24 is preferably disposed after the plurality of light sources 20 are disposed on the substrate 10. The sealing member 24 is configured to prevent or reduce damage of the light emitting element 21 caused by exposing the lateral surfaces of the semiconductor layered structure 22, the light-reflecting film 23 or the like, to ambient environment. Examples of the materials of the sealing member 24 include light-transmissive materials such as epoxy resin, silicone resin, resins which are mixtures of those, and glass. In view of light-resisting properties and ease of molding of the sealing member 24, silicone resin is preferably used.

The covering member 24 may include, for example, a light diffusing material, a fluorescent material, and/or a coloring agent. Examples of the fluorescent material include a yttrium aluminum garnet (YAG) activated with cerium, a lutetium aluminum garnet (LAG) activated with cerium, a nitrogen-containing calcium aluminosilicate (CaO—Al$_2$O$_3$—SiO$_2$) activated with europium and/or chromium, a silicate ((Sr,Ba)$_2$SiO$_4$) activated with europium, α-sialon phosphor, and β-sialon phosphor. Examples of the fluorescent materials that can convert blue light into green light include β-sialon-based fluorescent material, and examples of the fluorescent materials that can convert blue light into red light include fluoride-based fluorescent material such as KSF-based fluorescent materials, or the like. When the sealing member 24 contains a β-sialon-based fluorescent material and a fluoride-based fluorescent material such as a KSF-based fluorescent material, color reproduction range of the light emitting device can be expanded. When the sealing member 24 contains a fluorescent material, it is preferable to use the light emitting element 21 having a nitride semiconductor (In$_X$Al$_Y$Ga$_{1-X-Y}$N, 0≤X, 0≤Y, X+Y≤1) to emit light of shorter wavelength that can efficiently excite the fluorescent material.

The covering member 24 can be disposed to cover the light emitting element 21 and the light-reflecting film 23, by using a technique such as compression molding, injection molding, printing, dispenser-deposit, or the like. In particular, the shape of the covering member 24 can be controlled by optimizing the viscosity of a material of the covering member 24 and conducting dropping or drawing on the light emitting element 21, then using the surface tension of the material. Thus, the sealing member 24 can be disposed through a simpler method, without a need of a mold. The sealing member 24 can be formed in a shape, for example, a substantially hemispherical shape, a bulging dome shape (a height is larger than a lateral width) in a cross-sectional view, a flat dome shape (a lateral width is larger than a height) in a cross-sectional view, or a circular or elliptical shape in a top plan view.

Other Component Members

Further, at least one selected from the group consisting of a light-diffusing plate, a wavelength-converting sheet, a prism sheet, and a polarizing sheet, discussed below, may be arranged above the plurality of light sources.

Measuring First Light-Intensity Distribution

Figure 2C:
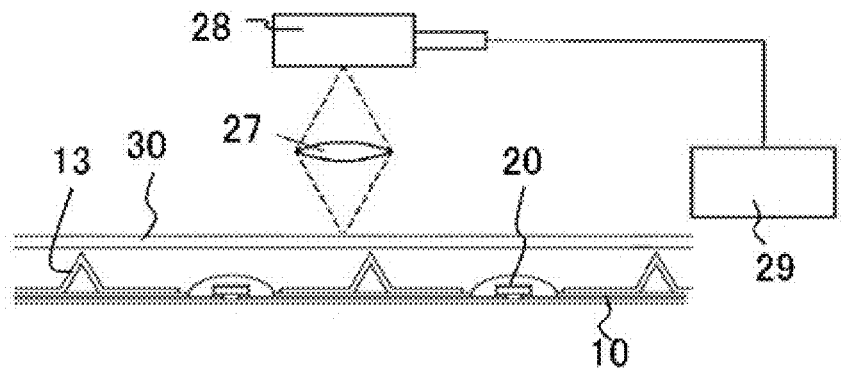

The plurality of light sources on the substrate are caused to emit light (Step S2 in FIG. 1) and a first light-intensity distribution is measured as shown in FIG. 2C (Step S3 in FIG. 1). It is preferable that the first light-intensity distribution corresponds to a light-intensity distribution of an entire plane located above the plurality of light sources 20 and in parallel to the substrate 10. In order to obtain the above, it is preferable that a position is set spaced apart from the substrate 10 at a predetermined distance, and an optical intensity over an entire plane in parallel to the substrate 10 is measured at the position, either through a lens 27 or directly, using an optical device such as a spectrometer, a photodetector, or the like. The data obtained from the measurement can be processed through an information processing system 29 such as a computer to acquire measurement values. The first light-intensity distribution can be obtained by directly measuring light emitted from the light sources 20, but it is preferable to measure the first light-intensity distribution through a light-diffusing plate 30, a light transmissive sheet, or the like, as a subject of disposing a light-reflecting pattern in a later step discussed below. With the first light-intensity distribution acquired by measuring a diffused state of light obtained through the light-diffusing plate 30 or the like, uneven distribution of amount light can be further reduced or prevented, such that more uniform light intensity distribution within the plane becomes possible.

Light-Diffusing Plate 30

The light-diffusing plate 30 is configured to allow incident light to transmit therethrough while being diffused, and is preferably located above the light sources 20. The light-diffusing plate 30 preferably has a flat plate-shape, and an irregular structure may be provided on the surface(s). The light-diffusing plate 30 is preferably located substantially in parallel to the substrate 10. The light-diffusing plate 30 can be formed with a material that hardly absorb visible light, such as polycarbonate resin, polystyrene resin, acrylic resin, polyethylene resin, or the like. Providing an irregular structure on the surface(s) of the light-diffusing plate 30, or dispersing a material of different refractive index in the light-diffusing plate 30, allows for diffusing light that enters the light-diffusing plate 30. The thickness of the light-diffusing plate 30 and the degree of diffusion of light can be appropriately set, and a light-diffusing sheet, a light-diffusing film, or the like, a material available in the market can be employed. Such a light-transmissive sheet can be formed with a material exhibiting small absorption of visible light, particularly light emitted from the light sources.

Forming Light-Reflecting Pattern

Figure 2D:
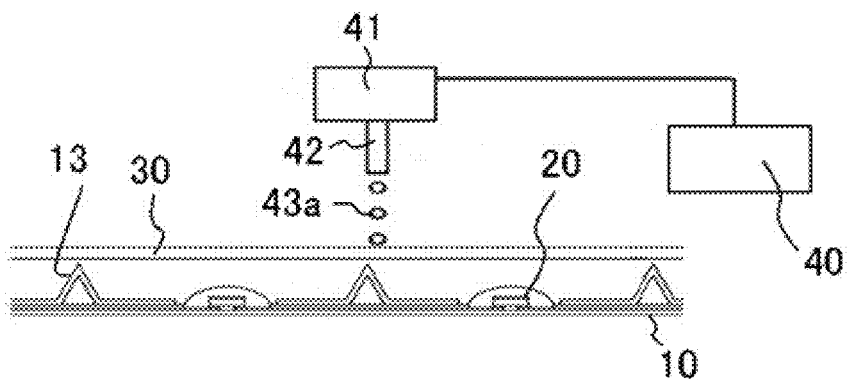

As shown in FIG. 2D, based on the measured value of the first light-intensity distribution, a light-reflecting pattern is disposed above the plurality of light sources 20, to create a second light-intensity distribution that is different from the first-light intensity distribution (Step S4 in FIG. 1). The unevenness in the first light intensity distribution has been compensated in the second light-intensity distribution, allowing for creating a light-intensity distribution that has been intended or that is close to the intended light-intensity distribution. Accordingly, the second light-intensity distribution corresponds to a light-intensity distribution of an entire plane located above the plurality of light sources 20 and in parallel to the substrate 10. In the present specification, the term "light-reflecting pattern" refers to a pattern provided over an entire surface of the substrate 10 having the plurality of light sources 20 disposed thereon.

The light-reflecting pattern can be located at any appropriate location above the plurality of light sources, but, as shown in FIGS. 2E, 6, 12 and 13, when one or more among the light-diffusing plate 30, the light-transmissive sheet 31, the wavelength converting sheet 32, the prism sheet 33, 34, the polarizing sheet 35, a brightness enhancement film (BEF), a dual brightness enhancement film (DBEF), and the like, are located above the light sources as discussed above, the light-reflecting pattern can be disposed on a surface of one of those, which is either facing or at the opposite side from the light sources. In particular, when the first light intensity distribution is measured through the light-diffusing plate 30, the light-reflecting pattern is preferably disposed on one surface of the light-diffusing plate 30 that is located opposite side from the light sources. Alternatively, in this case, the light-transmissive sheet may be arranged below or above the light-diffusing plate 30, above the plurality of light sources, and the light-reflecting pattern may be formed on one surface of the light-transmissive sheet. The one or more of the sheets discussed above are preferably directly stacked with each other, which allows arrangement without insertion of the air (air layer) therebetween, and thus the return light is reduced. Accordingly, luminance of the light emitting device can be improved.

The light-reflecting pattern can be formed with a material containing a light-reflecting material, such as a resin and/or an organic solvent, containing a light-reflecting material. Examples of light-reflecting material include particles of metal oxide such as titanium oxide, aluminum oxide, and silicon oxide. The resin and the organic solvent can be appropriately selected in view of the metal oxide particles and characteristics required for the light emitting device in its application. A preferable resin can be a light-transmissive photocurable resin, mainly containing an acrylate resin, an epoxy resin, or the like. The material of the light-reflecting pattern may further contain, for example, a pigment, a light-absorbing material, and/or a fluorescent material.

Figure 2E:
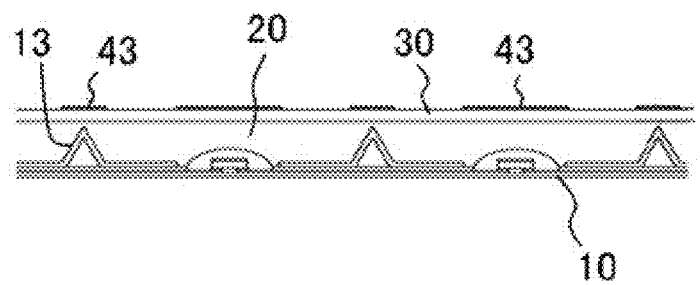

The light-reflecting pattern can be formed by using any appropriate method known in the art, such as a printing method, an ink jet method, and a spray method. In one embodiment, as illustrated in FIG. 2D, charged droplets of material 43a of the light-reflecting pattern are sprayed from a nozzle 42 of an ink jet printing device 41, the droplets are polarized by an electric field controlled by command signals generated from a control system 40 such as a computer, and adhered to predetermined locations on the surface of the light-diffusing plate 30. Thus, as illustrated in FIG. 2E, the light-reflecting pattern 43 of predetermined shapes can be formed. The light reflecting performance can be appropriately adjusted by adjusting the concentration of the light-reflecting material in the material of the light-reflecting pattern and/or by altering the thickness of the resin deposit. The light-reflecting pattern may be formed on the entire surface in a single step, or through a plurality of steps while maintaining or changing the material and/or the concentration of the material.

A predetermined light-reflecting pattern can be formed by, for example, adjusting the amount of the material of the light-reflecting pattern or/and the thickness of the deposit material in a region exhibiting particularly high light intensity in the first light-intensity distribution. Accordingly, unevenness in the first light-intensity distribution can be reduced, and the light-intensity of the entire plane above the substrate 10 can be in the second light-intensity distribution exhibiting more uniform light-intensity distribution as a whole. In other words, uneven distribution of amount of light within the plane associated to light sources 20 due to individual differences in members structuring the light sources 20 is premeasured as the first light-intensity distribution, such that light intensity unfit to the intended second light-intensity distribution can be easily determined according to the measured values. The light intensity to be complemented can be recognized based on the determined result, such that forming the light-reflecting pattern based on the determined result allows for achieving intended second light-intensity distribution with ease and reliably. The light-reflecting pattern can be formed for each substrate to be installed in a single light emitting device, at time subsequent to disposing of the light sources on the substrate or to disposing of the predetermined member(s) described above, such that uneven light intensity distribution (uneven luminance distribution) due to individual differences in the members can be corrected efficiently, in a simplified steps and easily. Accordingly, mass production of high-quality light emitting devices becomes possible.

Figure 4B:
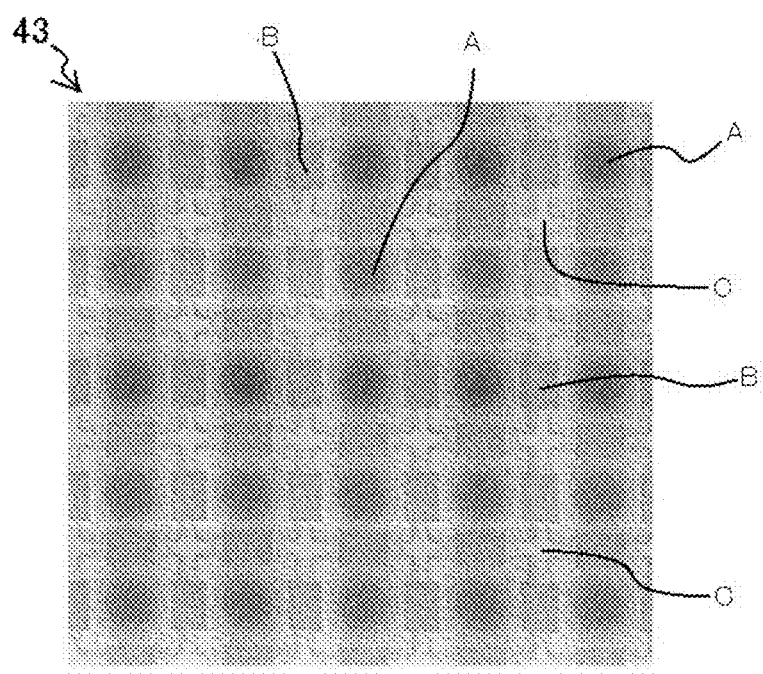
FIG. 4B is a plan view showing one example of a light-reflecting pattern formed in the method of manufacturing a light source according to the present invention.

More specifically, the method includes: (S1) providing the substrate 10 having the wall parts 13 demarcating regions and the light sources 20 each being disposed in a respective one of the regions surrounded by the wall parts 13 as shown in FIG. 4A; (S2) causing the light sources to emit light; (S3) measuring the first light intensity distribution; and (S4) the light-reflecting pattern is formed. As shown in FIG. 4B, the light-reflecting pattern 43 is formed with altering the thickness and/or the concentration of the material 43a of the light-reflecting pattern 43 mainly at regions A corresponding to a portion directly above and surrounding each of the light sources 20, regions B corresponding to the wall parts 13 facing a respective one of the plurality of light sources 20 and to portions surrounding the wall parts 13, and regions C corresponding to intersecting portions of adjacent wall parts 13 each being a part of the wall parts 13 surrounding different regions and to portions surrounding the intersecting portions. In the embodiment illustrated in FIG. 4B, each of the regions A has a circular shape in a plan view, each of the regions B has a rectangular shape in a plan view, and each of the regions C has a cross shape in a plan view, which corresponds to intersecting portion of the wall parts 13. The boundary portions of the regions of the light-reflecting pattern 43 may be formed with an abrupt change in the thickness and/or the concentration of the material 43a of the light-reflecting pattern 43, but preferably formed with a gradual change in the thickness and/or the concentration of the material 43a of the light-reflecting pattern 43. The thickness and/or the concentration of the material 43a of the light-reflecting pattern 43 is greatest in the regions A, followed by the regions B, whereas the material 43a of the light-shielding pattern 43 is not applied in the regions C.

Figure 5A:
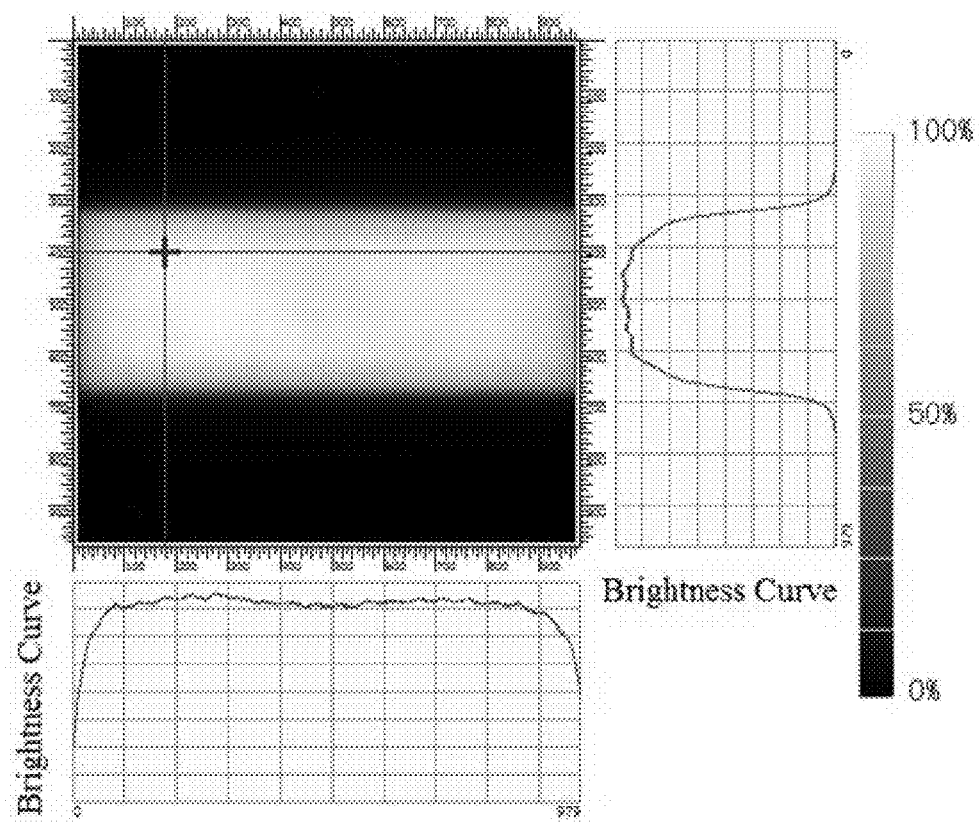
FIG. 5A is a graph showing light distribution characteristics of a light emitting device that has the light-reflecting pattern formed in the method of manufacturing a light source according to the present invention.
Figure 5B:
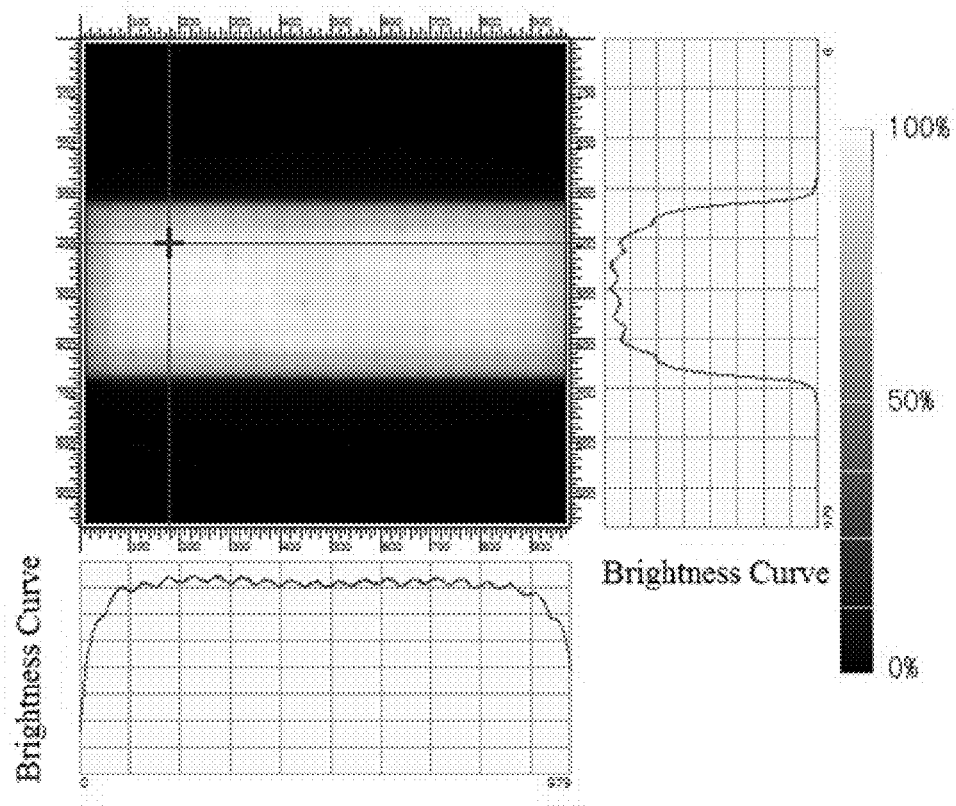
FIG. 5B is a graph showing light distribution characteristics of a light emitting device according to a comparative example, which does not have the light-reflecting pattern.
Figure 6:
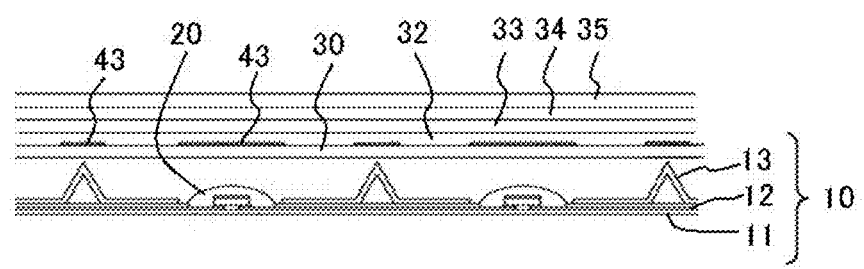
FIG. 6 is a schematic cross-sectional view showing one example of a light emitting device obtained according to the present invention.

For example, when the light emitting device includes seven of the light sources 20 in each column and twenty of the light sources 20 in each row, and a light-reflecting pattern of that shown in FIG. 4B formed corresponding to the light sources 20, more uniform distribution of light in the plane can be achieved as shown in FIG. 5A, compared to that of a light emitting device without provided with the light-reflecting pattern, for example, as shown in FIG. 5B. Further, at a predetermined point in the plane (i.e., a point directly above a single light source 20, further, a point directly above the light emitting element 21), the luminance intensity in a x-direction and in a y-direction respectively exhibits more uniform distribution of luminance intensity in the light emitting device having the light-reflecting pattern according to the present embodiment as shown in FIG. 5A, compared to that of the light emitting device that is not provided with the light-reflecting pattern, as shown in FIG. 5B. In the present embodiment, the light-reflecting pattern of the light emitting device is formed by using a printing method as described above, using a silicone resin solution containing titanium oxide (titanium oxide:silicone resin=20:80 in weight ratio). Also, in the present embodiment, as shown in FIG. 6, the light emitting device includes an optical member located above the light sources 20 disposed on the substrate 10. The optical member includes a layered structure, in which the light-reflecting pattern 43 is located on an upper surface of the light-diffusing plate 30, on which a wavelength-converting sheet 32, a first prism sheet 33, a second prism sheet 34, and a polarizing sheet 35 describe above are located in this order. The distribution of light is measured from above the optical member.

Figure 7:
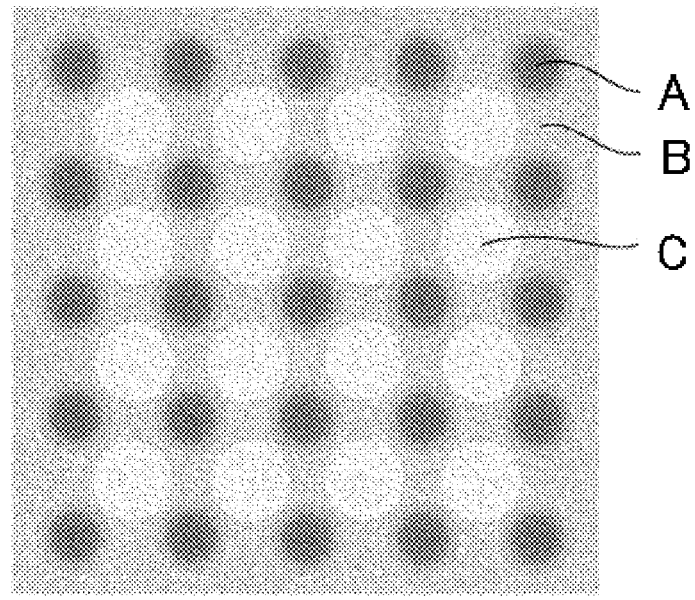
FIG. 7 is a plan view showing another example of light-reflecting pattern formed in the method of manufacturing a light source according to the present invention.
Figure 8:
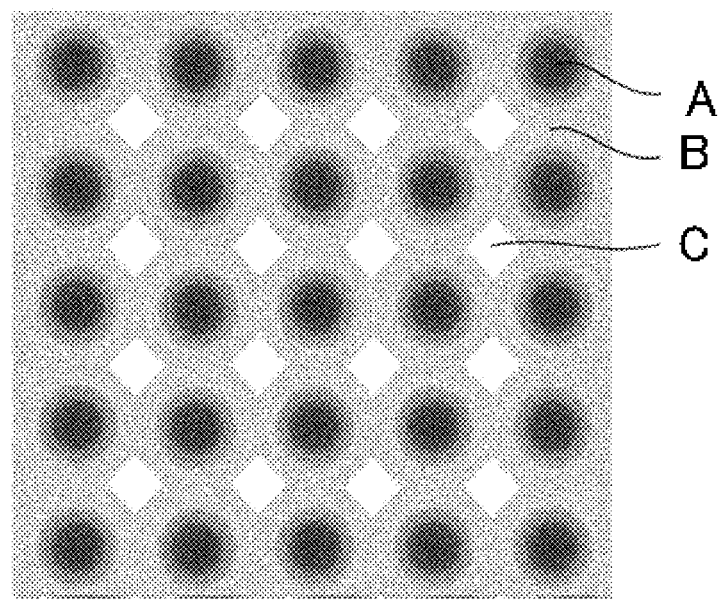
FIG. 8 is a plan view showing still another example of light-reflecting pattern formed in the method of manufacturing a light source according to the present invention.
Figure 9:
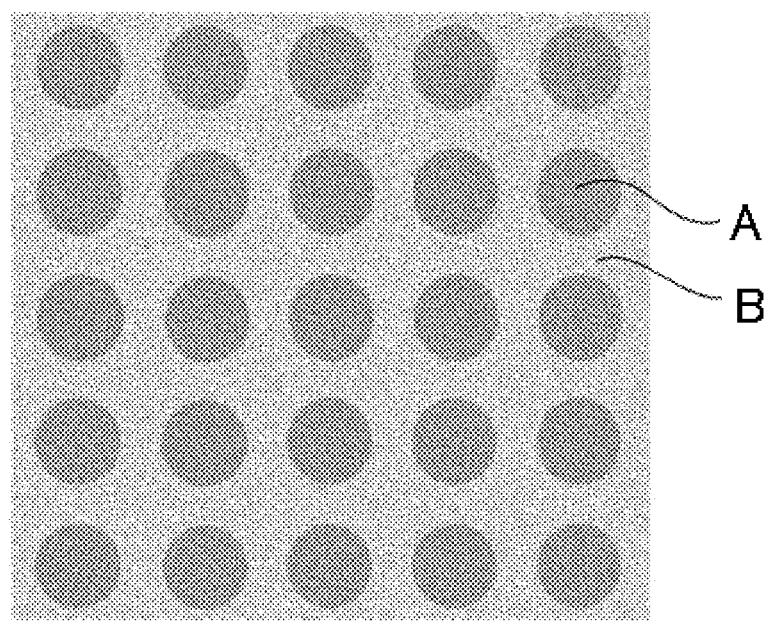
FIG. 9 is a plan view showing still another example of light-reflecting pattern formed in the method of manufacturing a light source according to the present invention.
Figure 10:
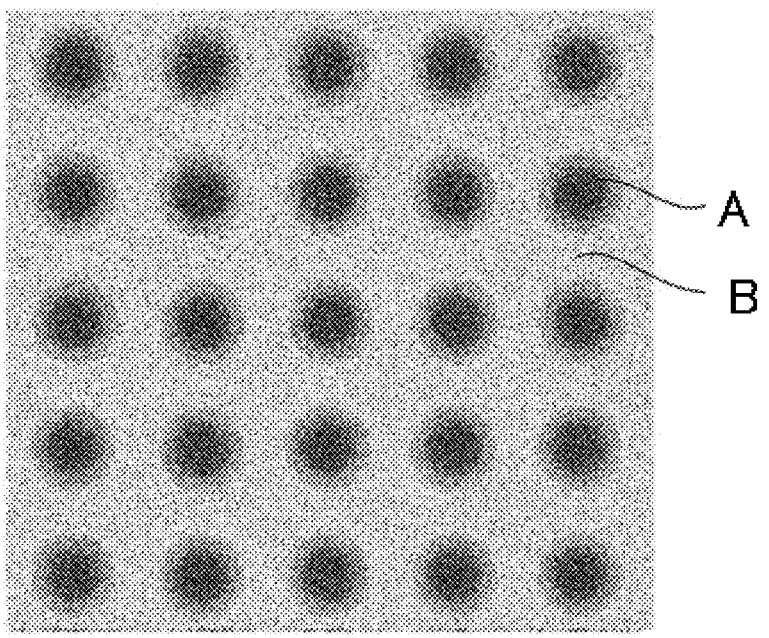
FIG. 10 is a plan view showing still another example of light-reflecting pattern formed in the method of manufacturing a light source according to the present invention.
Figure 11:
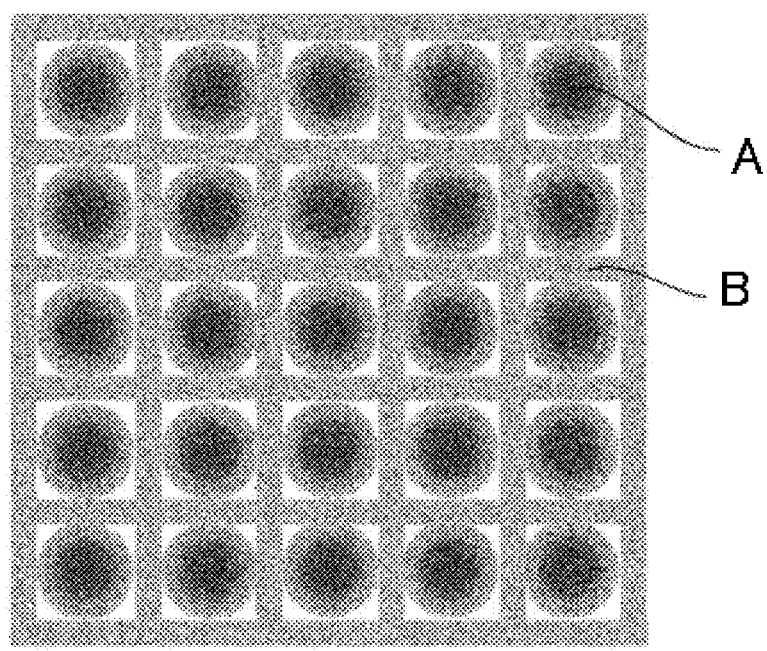
FIG. 11 is a plan view showing still another example of light-reflecting pattern formed in the method of manufacturing a light source according to the present invention.
Figure 12:
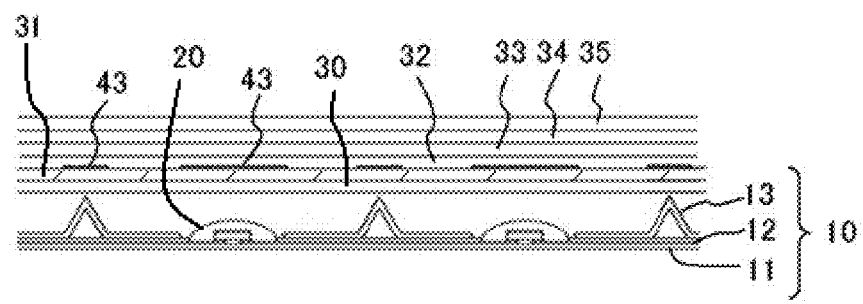
FIG. 12 is a schematic cross-sectional view showing one example of a light emitting device obtained according to the present invention.

In other embodiments, as shown in FIG. 7 and FIG. 8, the regions corresponding to the region A, the regions corresponding to the regions B, and the regions corresponding to the regions C can be arranged in various shapes. Also, as shown in FIG. 9 to FIG. 11, the regions corresponding to the regions A and the regions corresponding to the regions B may be arranged in various shapes whereas the regions corresponding to the regions C are not provided.

In the method of manufacturing a light emitting device according to certain embodiment of the present invention, successive to forming the (first) light-reflecting pattern (Step S4), the light intensity distribution is measured through the light-reflecting pattern to determine whether the light intensity distribution fits the intended light intensity distribution (Step S5), and if the light intensity distribution is determined as uneven, a second light-reflecting pattern may be formed based on the measurement result of the light intensity distribution (Step S4).

In the method of manufacturing a light emitting device according to certain embodiment of the present invention, prior to or successive to forming the light-reflecting pattern, at least one selected from the group consisting of a wavelength-converting sheet, a prism sheet, and a polarizing sheet may be disposed above or under the light-reflecting pattern. For example, as shown in FIG. 6, the light-diffusing plate 30 having the light-reflecting pattern 43 formed on its upper surface, the wavelength-converting sheet 32, the first prism sheet 33, the second prism sheet 34, and the polarizing sheet 35 can be layered in this order above the light sources 20 disposed on the substrate 10.

Figure 13:
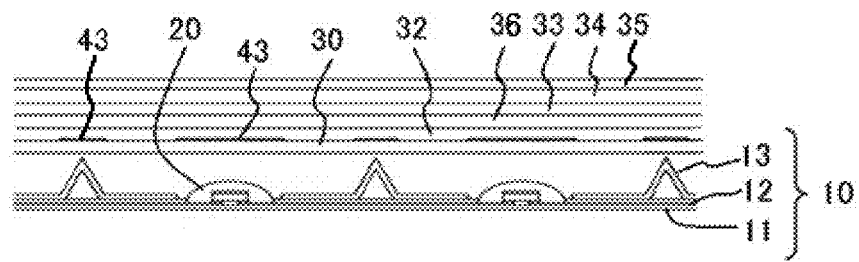
FIG. 13 is a schematic cross-sectional view showing one example of a light emitting device obtained according to the present invention.

Further, in the method according to certain embodiments of the present invention, successive to forming the light-reflecting pattern, with or without performing measuring in a similar manner as in measuring the first light intensity distribution, a color-converting pattern 36 (see, FIG. 13) based on the measurement result of the light intensity distribution may be formed on, for example, one surface or above of one of the sheets described above (e.g., on wavelength converting sheet 32 as shown in FIG. 13), by using a resin and/or an organic solvent containing a fluorescent material. In particular, in certain embodiments using a wavelength converting sheet, unevenness (particularly unevenness in the distribution of the color of light) after passing the wavelength converting sheet can be reduced by disposing the color-converting sheet. Alternatively, prior to forming the light-reflecting pattern, the first light intensity distribution is measured and based on the measurement result, a color-converting pattern may be formed on one surface of one of the sheets described above, by using a resin and/or an organic solvent containing a fluorescent material. In this case, the light-reflecting pattern is disposed on or above the color-converting pattern, and the color-converting pattern and the light-reflecting pattern may be formed, for example, on one surface of a single sheet or one surface of different sheets.

Wavelength-Converting Sheet 32

The wavelength converting sheet 32 can be disposed on the light-diffusing plate 30, either on the side facing the substrate 10 or opposite side from the substrate 10, but the opposite side is preferable. The wavelength-converting sheet 32 is configured to absorb a portion of light emitted from the light sources 20 and emit light having a wavelength different from the wavelength of light emitted from the light sources 20. For example, the wavelength-converting sheet 32 absorbs a portion of blue light emitted from the light sources 20 and emits yellow light, or the wavelength-converting sheet 32 absorbs a portion of blue light emitted from the light sources 20 and emits green light and red light. With the use of either of the wavelength converting sheet 32 described above, a light source device to emit white light can be obtained. The wavelength converting sheet 32 is located spaced apart from the light emitting elements 21 of the light sources 20, allowing for use of a fluorescent material or the like, which is less resistant to light of high intensity and cannot be used near the light emitting elements 21. Accordingly, when the light source device is used as a backlight of a light emitting device, performance as a backlight in a light emitting device can be improved. The wavelength converting sheet 32 has a sheet shape or a layer shape, and includes the fluorescent material etc. described above.

First Prism Sheet 33 and Second Prism Sheet 34

The first prism sheet 33 and the second prism sheet 34 respectively has a surface provided with a plurality of prisms extending in a predetermined direction. For example, the first prism sheet 33 has a plurality of prisms extending in the x-direction and the second prism sheet 34 has a plurality of prisms extending in the y-direction. The prism sheets are configured such that light incident on the prism sheet from different directions is reflected in a direction toward a display panel that is facing the light emitting device. Accordingly, light emitted from the light-emitting surface of the light emitting device can be directed mainly in an upward direction perpendicular to the upper surface of the light emitting device, such that the luminance viewed from the front of the light emitting device can be increased.

Polarizing Sheet 35

The polarizing sheet 35 can be configured, for example, to selectively transmit light traveling in the polarization direction of a polarization plate that is located at a backlight side of a display panel, for example, a liquid crystal display panel, and to reflect the polarized light traveling in a direction perpendicular to the polarization direction toward the first prism sheet 33 and the second prism sheet 34. Portions of light returned from the polarizing sheet 35 are reflected again at the first prism sheet 33, the second prism sheet 34, the wavelength converting sheet 32, and the light-diffusing plate 30. At this time, the polarization direction is changed and converted into, for example, polarized light in polarization direction of the polarization plate of a liquid crystal display panel, and the polarized light enters the polarizing sheet 35 again and emitted toward the display panel. Accordingly, the polarization directions of light emitted from the light emitting device can be aligned, such that light in the polarization direction effective for improving the luminance of the display panel can be emitted with high efficiency. The polarizing sheet 35, the first prism sheet 33, the second prism sheet 34, etc., that are commercially available as optical members for backlight can be employed.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light source device, the method comprising:
    providing a substrate having a plurality of light sources disposed thereon;
    causing the plurality of light sources to emit light;
    measuring a first light-intensity distribution of an entire surface that is in parallel to the substrate and located above the plurality of light sources; and
    forming a light-reflecting pattern by applying a reflecting material above the plurality of light sources such that a light-reflecting performance of the light-reflecting pattern is adjusted based on a measured value of the first light-intensity distribution to obtain a second light-intensity distribution that is different from the first light-intensity distribution.

2. The method of manufacturing a light source device according to claim 1, further comprising
    arranging a light-diffusing plate above the plurality of light sources,
    wherein the measuring of the first light-intensity distribution includes measuring the first light-intensity distribution on the light-diffusing plate.

3. The method of manufacturing a light source device according to claim 2, wherein
    the forming of the light-reflecting pattern includes forming the light-reflecting pattern on one surface of the light-diffusing plate.

4. The method of manufacturing a light source device according to claim 3, wherein
    the forming of the light-reflecting pattern includes forming the light-reflecting pattern using the reflecting material that contains a light-reflecting material made of metal oxide particles.

5. The method of manufacturing a light source device according to claim 3, wherein
    the providing of the substrate includes providing the substrate having the plurality of light sources respectively including one or more light emitting elements and a light-reflecting film disposed on an upper surface of each of the one or more light emitting elements.

6. The method of manufacturing a light source device according to claim 3, wherein
    the providing of the substrate includes providing the substrate further having wall parts surrounding each of the plurality of light sources.

7. The method of manufacturing a light source device according to claim 3, further comprising
    arranging at least one selected from the group consisting of a wavelength-converting sheet, a prism sheet, and a polarizing sheet.

8. The method of manufacturing a light source device according to claim 3, further comprising
    forming a color-converting pattern above the light-reflecting pattern.

9. The method of manufacturing a light source device according to claim 2, further comprising
    arranging a light-transmissive sheet above the plurality of light sources,
    wherein the forming of the light-reflecting pattern includes forming the light-reflecting pattern on one surface of the light-transmissive sheet.

10. The method of manufacturing a light source device according to claim 9, wherein
    the forming the light-reflecting pattern includes forming the light-reflecting pattern using the reflecting material that contains a light-reflecting material made of metal oxide particles.

11. The method of manufacturing a light source device according to claim 9, wherein
    the providing of the substrate includes providing the substrate having the plurality of light sources respectively including one or more light emitting elements and a light-reflecting film disposed on an upper surface of each of the one or more light emitting elements.

12. The method of manufacturing a light source device according to claim 9, wherein
    the providing of the substrate includes providing the substrate further having wall parts surrounding each of the plurality of light sources.

13. The method of manufacturing a light source device according to claim 9, further comprising
    arranging at least one selected from the group consisting of a wavelength-converting sheet, a prism sheet, and a polarizing sheet.

14. The method of manufacturing a light source device according to claim 9, further comprising
    forming a color-converting pattern above the light-reflecting pattern.

15. The method of manufacturing a light source device according to claim 1, further comprising
    arranging a light-transmissive sheet above the plurality of light sources,
    wherein the forming of the light-reflecting pattern includes forming the light-reflecting pattern on one surface of the light-transmissive sheet.

16. The method of manufacturing a light source device according to claim 1, wherein
    the forming of the light-reflecting pattern includes forming the light-reflecting pattern using the reflecting material that contains a light-reflecting material made of metal oxide particles.

17. The method of manufacturing a light source device according to claim 1, wherein the providing of the substrate includes providing the substrate having the plurality of light sources respectively including one or more light emitting elements and a light-reflecting film disposed on an upper surface of each of the one or more light emitting elements.

18. The method of manufacturing a light source device according to claim 1, wherein the providing of the substrate includes providing the substrate further having wall parts surrounding each of the plurality of light sources.

19. The method of manufacturing a light source device according to claim 1, further comprising arranging at least one selected from the group consisting of a wavelength-converting sheet, a prism sheet, and a polarizing sheet above the plurality of light sources.

20. The method of manufacturing a light source device according to claim 1, further comprising forming a color-converting pattern above the light-reflecting pattern.

21. The method of manufacturing a light source device according to claim 1, wherein the light-reflecting performance of the light-reflecting pattern is adjusted by adjusting a concentration of a light-reflecting material contained in the reflecting material.

22. The method of manufacturing a light source device according to claim 1, wherein the light-reflecting performance of the light-reflecting pattern is adjusted by altering a thickness of the reflecting material applied above the plurality of light sources.

23. The method of manufacturing a light source device according to claim 1, wherein the forming of the light-reflecting pattern includes forming the light-reflecting pattern having first regions directly above the plurality of light sources, respectively, and a second region different from the first regions.

* * * * *